(12) United States Patent
Wu et al.

(10) Patent No.: US 9,076,730 B2
(45) Date of Patent: Jul. 7, 2015

(54) METAL SILICIDE THIN FILM, ULTRA-SHALLOW JUNCTIONS, SEMICONDUCTOR DEVICE AND METHOD OF MAKING

(71) Applicants: Dongping Wu, Shanghai (CN); Peng Xu, Shanghai (CN); Wei Zhang, Shanghai (CN); Shi-Li Zhang, Stockholm (SE)

(72) Inventors: Dongping Wu, Shanghai (CN); Peng Xu, Shanghai (CN); Wei Zhang, Shanghai (CN); Shi-Li Zhang, Stockholm (SE)

(73) Assignee: FUDAN UNIVERSITY, Shanghai (CN)

( * ) Notice: Subject to any disclaimer, the term of this patent is extended or adjusted under 35 U.S.C. 154(b) by 0 days.

(21) Appl. No.: 13/704,601

(22) PCT Filed: Dec. 12, 2012

(86) PCT No.: PCT/CN2012/086456
§ 371 (c)(1),
(2) Date: Dec. 14, 2012

(87) PCT Pub. No.: WO2014/089783
PCT Pub. Date: Jun. 19, 2014

(65) Prior Publication Data
US 2014/0284728 A1   Sep. 25, 2014

(51) Int. Cl.
*H01L 21/285* (2006.01)
*H01L 29/66* (2006.01)
(Continued)

(52) U.S. Cl.
CPC .... *H01L 21/28518* (2013.01); *H01L 29/66742* (2013.01);
(Continued)

(58) Field of Classification Search
CPC ............ H01L 21/28061; H01L 29/665; H01L 21/823443; H01L 21/32053; H01L 21/823835; H01L 21/76889
USPC ......................................................... 438/649
See application file for complete search history.

(56) References Cited

U.S. PATENT DOCUMENTS 6,096,599 A * 8/2000 Kepler et al. .................. 438/249
6,281,087 B1 * 8/2001 Tseng ........................... 438/305
(Continued)

OTHER PUBLICATIONS

Jiang et al. "Ultra shallow junction formation using diffusion from silicides: I. Silicide formation, dopant implantation and depth profiling." J. Electrochem. Soc., vol. 139, No. 1, Jan. 1992. pp. 196-206.*

*Primary Examiner* — Michael Jung
*Assistant Examiner* — Mikka Liu
(74) *Attorney, Agent, or Firm* — Jamie J. Zheng, Esq.

(57) ABSTRACT

A metal silicide thin film and ultra-shallow junctions and methods of making are disclosed. In the present disclosure, by using a metal and semiconductor dopant mixture as a target, a mixture film is formed on a semiconductor substrate using a physical vapor deposition (PVD) process. The mixture film is removed afterwards by wet etching, which is followed by annealing to form metal silicide thin film and ultra-shallow junctions. Because the metal and semiconductor dopant mixture is used as a target to deposit the mixture film, and the mixture film is removed by wet etching before annealing, self-limiting, ultra-thin, and uniform metal silicide film and ultra-shallow junctions are formed concurrently in semiconductor field-effect transistor fabrication processes, which are suitable for field-effect transistors at the 14 nm, 11 nm, or even further technology node.

17 Claims, 5 Drawing Sheets

(51) Int. Cl.
*H01L 29/786* (2006.01)
*H01L 21/324* (2006.01)

(52) U.S. Cl.
CPC .......... *H01L 29/786* (2013.01); *H01L 21/324* (2013.01); *H01L 29/665* (2013.01); *H01L 29/66575* (2013.01); *H01L 29/66643* (2013.01)

(56) References Cited

U.S. PATENT DOCUMENTS

| | | | |
|---|---|---|---|
| 6,281,126 B1 * | 8/2001 | Arakawa | 438/682 |
| 2005/0009343 A1 * | 1/2005 | Fishburn et al. | 438/689 |
| 2009/0184399 A1 * | 7/2009 | Kowalski et al. | 257/618 |

* cited by examiner

METAL SILICIDE THIN FILM, ULTRA-SHALLOW JUNCTIONS, SEMICONDUCTOR DEVICE AND METHOD OF MAKING

FIELD

The present disclosure is related to semiconductor technology, and more particularly to a metal silicide thin film and ultra-shallow junctions and methods of making.

BACKGROUND

With the advances in the semiconductor industry and associated technology innovations, feature sizes of semiconductor devices are becoming smaller and smaller. As the horizontal or lateral dimension of a device continues to shrink, the vertical dimension (i.e., the device depth) is also being reduced proportionally. Particularly, after passing the 65 nm technology node, the source/drain regions and the source/drain extensions are required to be become shallower accordingly. Doped junctions with a junction depth of less than 100 nm is usually referred to as an ultra-shallow junction (USJ). Ultra-shallow junctions can improve the short channel effect of the device. As ultra-shallow junctions become shallower and shallower, how to resolve the conflict between reducing serial parasitic resistance and further decreasing the junction depths for the ultra-shallow junctions becomes a main challenge faced by ultra-shallow junction technologies.

Conventionally, ion implantation technology is usually used to form ultra-shallow junctions, such as highly doped source/drain regions of a metal oxide semiconductor (MOS) transistor. Using the gate structure as a mask, PN junctions can be formed by implanting N-type or P-type dopants into the semiconductor substrate. A metal film can be subsequently deposited, followed by annealing, during which metal silicide is formed, and wet etching is then used to remove any excess or remaining metal. As the transistor size shrinks, the gate length also decreases. With the continually decreasing gate length, the source/drain and source/drain extension regions need to become more and more shallow accordingly.

Currently, ultra-low energy ion implantation and millisecond laser annealing technologies are used to form ultra-shallow junctions. In the future, the junction depth of ultra-shallow junctions in semiconductor field-effect transistors can become smaller than 10 nm. Because of the immense challenges faced by the ultra-low energy ion implantation technologies and the generally occurring dopant diffusions during annealing and dopant activation, using conventional ultra-low energy ion implantation and annealing technologies to form ultra-shallow junctions suitable for field-effect transistors of future technology nodes shall face insurmountable challenges.

SUMMARY

The present disclosure provides a method of making a metal silicide thin film and ultra-shallow junctions, so that self-limiting, ultra-thin, and uniform metal silicide film and ultra-shallow junctions are formed concurrently in semiconductor field-effect transistor fabrication processes.

According to one embodiment, a method of making metal silicide thin film and ultra-shallow junctions comprises:

A. providing a semiconductor substrate;
B. using a metal and semiconductor dopant mixture as a target, depositing a mixture film on the semiconductor substrate by physical vapor deposition;
C. removing the mixture film by wet etching; and
D. performing annealing on the semiconductor substrate with the mixture film deposited and removed, to form metal silicide and ultra-shallow junctions, the ultra-shallow junction being a PN junction or a metal-semiconductor junction;

Embodiments of the present invention also provide a metal silicide thin film and ultra-shallow junctions, the metal silicide thin film and ultra-shallow junctions being formed by depositing a mixture film on a semiconductor substrate using a physical vapor deposition (PVD) process, and removing the mixture film by wet etching, which is followed by annealing. The PVD process uses a metal and semiconductor dopant mixture as a target.

Compared to conventional technologies, embodiments of the present disclosure form metal silicide thin film and ultra-shallow junctions by forming a mixture film on a semiconductor substrate using a physical vapor deposition (PVD) process and removing the mixture film by wet etching, which is followed by annealing to form metal silicide thin film and ultra-shallow junctions. The PVD process uses a metal and semiconductor dopant mixture as a target. Because the metal and semiconductor dopant mixture is used as a target to deposit the mixture film, and the mixture film is removed by wet etching before annealing, self-limiting, ultra-thin, and uniform metal silicide film and ultra-shallow junctions are formed concurrently in semiconductor field-effect transistor fabrication processes, which are suitable for field-effect transistors at the 14 nm, 11 nm, or even further technology node.

In a further embodiment, before the above step D, steps B and C are repeated at least once. That is, before annealing, deposition of a mixture film and its removal by wet etching are performed multiple times. Thus, a thickness of the metal silicide film and a depth of the ultra-shallow junctions can be limited by the number of repetitions of steps B and C, resulting in more uniformity in the finally formed metal silicide film and ultra-shallow junctions.

In a further embodiment, as steps B and C are repeatedly performed, a different mixture of metal and semiconductor dopant is used as the target during a repeated step B. That is, one or more metals used to fabricate the metal silicide film can be selected according to practical requirements, allowing a larger selection of metals to be used to make the metal silicide, so as to minimize the resistance of the metal silicide and to allow more flexible applications.

Furthermore, in the above Step B, the target material can be ionized into an ionic state, causing it to produce metal ions and semiconductor dopant ions. Also, a substrate bias voltage can be applied to the semiconductor substrate. Ionizing the target material into an ionic state can be done by applying a first bias voltage onto the target.

Ionizing the target and applying a substrate bias voltage on the semiconductor substrate to deposit the mixture film can cause, on one hand, metal ions and semiconductor dopant ions to be accelerated toward and deposited on the semiconductor substrate, allowing control of a diffusion depth of the ions. On the other hand, the uniformity and stability of the thin film deposited on the three-dimensional structure can be enhanced.

In a further embodiment, microwave annealing can be used in step D. During the microwave annealing, multi-mode and multi-frequencies are employed in the microwave annealing chamber.

By using microwave annealing technology, metal silicide and ultra-shallow junctions can be formed under relatively low temperature, resulting in the metal silicide to exist stably.

DETAILED DESCRIPTION OF THE EMBODIMENTS

Various embodiments of the present disclosure are explained in detail with reference to the drawings. Those of ordinary skill in the art should understand, however, that many technical details are set forward in the various embodiments in order for the readers to better understand the present disclosure. The technology schemes claimed to be protected by the appended claims, however, can be implemented without such technical details, by making proper modifications and changes to the various embodiments.

Figure 1:
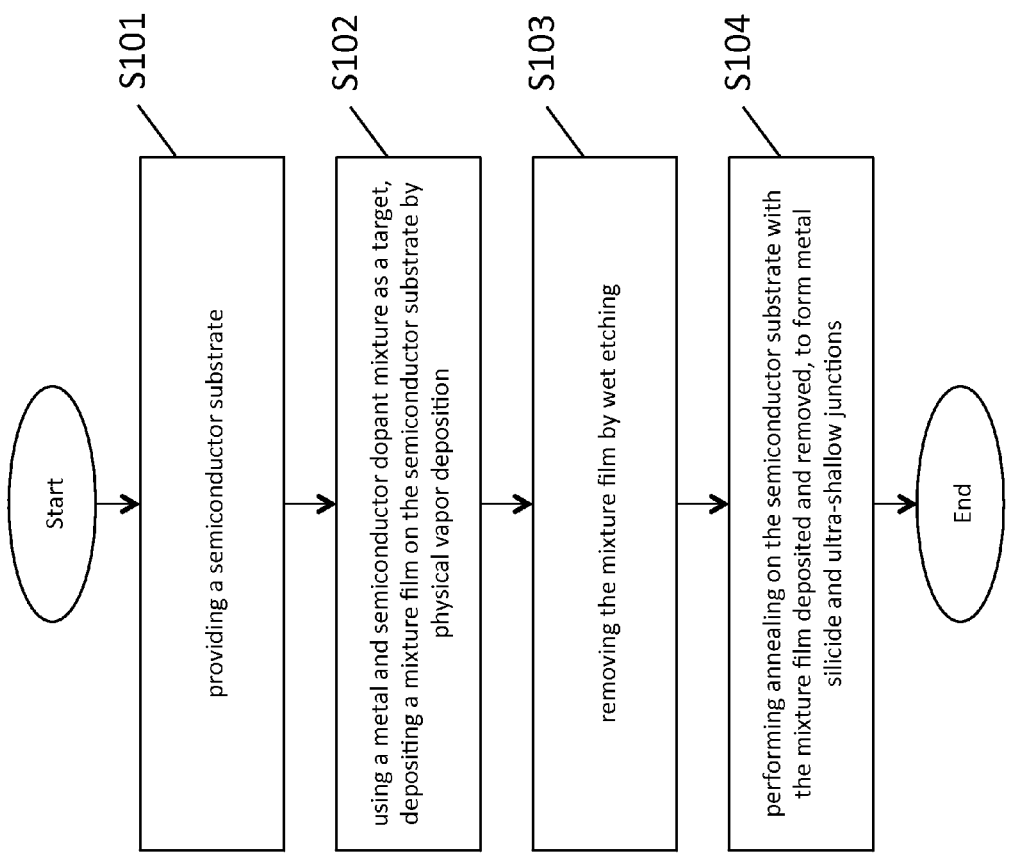
FIG. 1 is a flow chart illustrating a method of making a metal silicide film and ultra-shallow junctions according to one embodiment of the present invention.

According to one embodiment of the present disclosure, as illustrated in the flowchart in FIG. 1, a method of making a metal silicide film and ultra-shallow junctions comprises the following process steps.

Figure 2A:
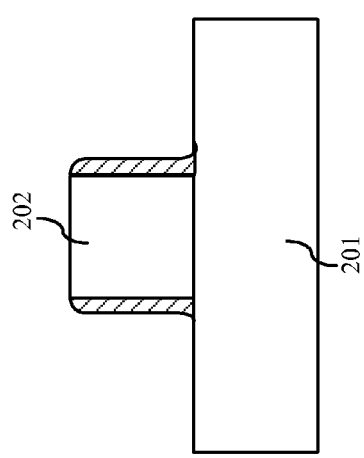
FIGS. 2A to 2E are cross-sectional diagrams illustrating various steps in the method of making a metal silicide film and ultra-shallow junctions according to one embodiment of the present invention.

In Step 101, a semiconductor substrate is provided and, as shown in FIG. 2A, the semiconductor substrate 201 can include silicon (Si), germanium (Ge), silicon-germanium alloy (SiGe), and/or any of the III-V semiconductors. The semiconductor substrate may have a gate structure 202 formed thereon. The gate structure may include a gate dielectric, a gate electrode, and spacers along sidewalls of the gate electrode and the gate dielectric, and can be formed using conventional technologies, detailed description of which is omitted here.

Figure 2B:
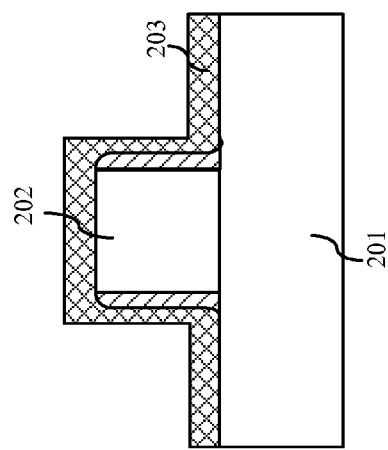
Figure 2C:
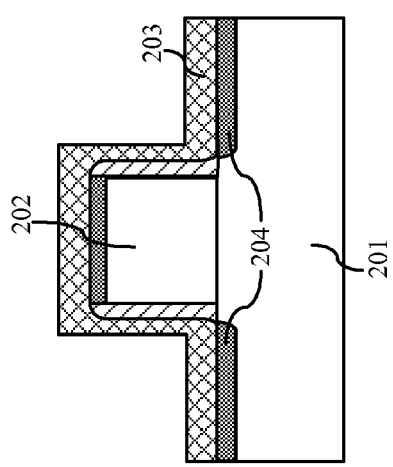
Figure 2D:
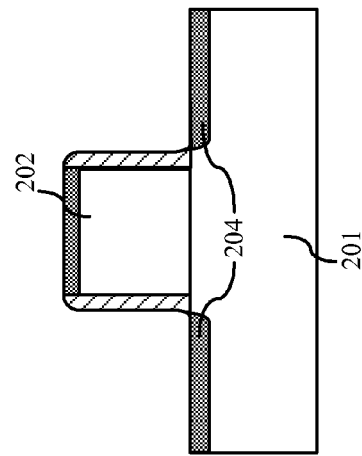

In Step 102, a mixture film is deposited on the semiconductor substrate by physical vapor deposition (PVD), using a metal and semiconductor dopant mixture as a target. As shown in FIG. 2B, a mixture film 203 is formed. After depositing the mixture film, metal ions and semiconductor dopant ions can diffuse into the semiconductor substrate, forming ultra-shallow ion diffusion regions 204, as shown in FIG. 2C. Specifically, metal in the mixture film reacts with the semiconductor substrate to form metal silicide, while semiconductor dopants in the mixture film diffuse into the metal silicide(s), interfaces between the metal silicide and the semiconductor substrate, interfaces between ion diffusion regions and the semiconductor substrate, and the semiconductor substrate, forming the ion diffusion regions 204.

Figure 3:
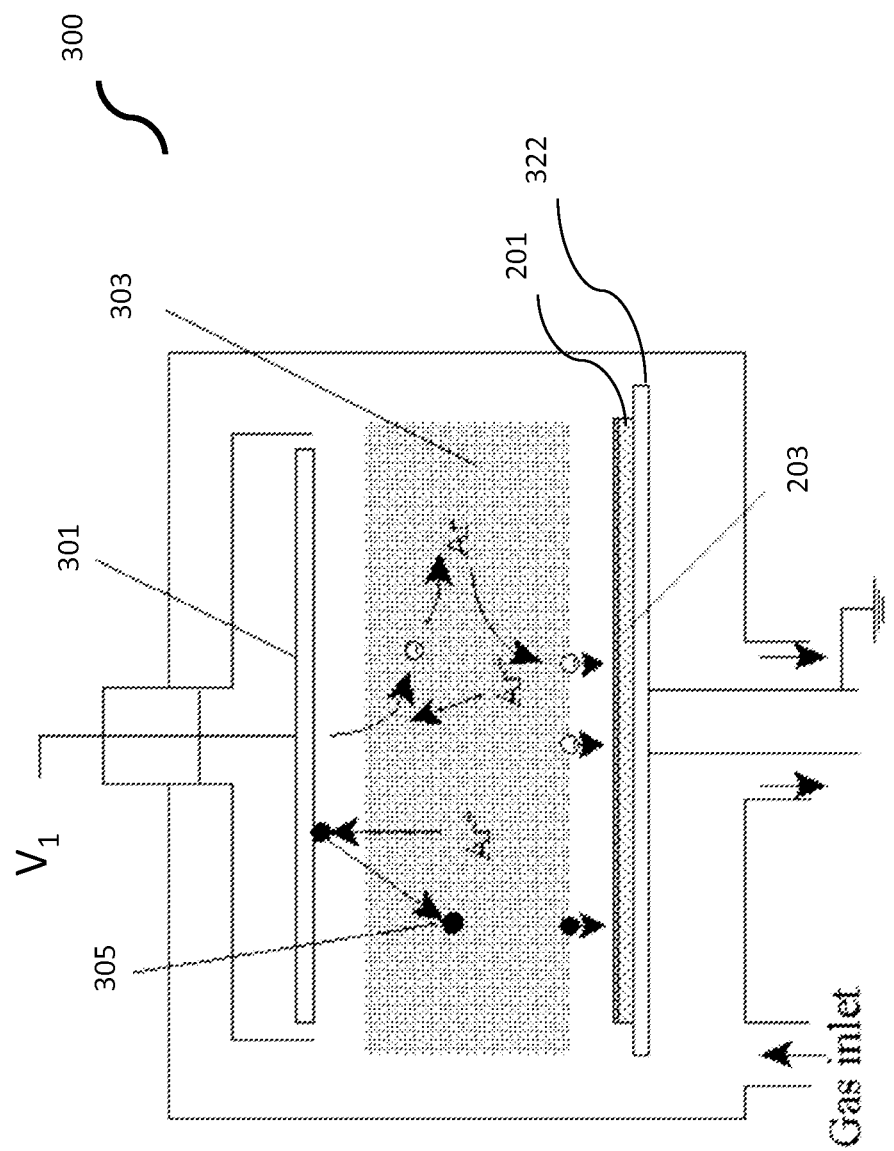
FIG. 3 is a schematic block diagram illustrating a physical vapor deposition (PVD) chamber that can be employed to deposit a mixture film of metal and semiconductor dopants on a semiconductor substrate.

Physical vapor deposition (PVD) is a known technique used in the manufacture of integrated circuits. In PVD, a target of a desired coating material is caused to eject target material, which is then deposited onto a substrate. As shown in FIG. 3, which illustrate an exemplary PVD chamber, in one embodiment, the target 301 and the semiconductor substrate 201 with the gate structure 202 formed thereon are placed in a vacuum chamber 300, which is evacuated to and maintained at a very low pressure (e.g., less than 10 mTorr). In one embodiment, the target 301 is a metal-rich mixture in the form of polycrystalline solid material. The mixture can be made by mixing metal powder with semiconductor dopant powder followed by thermal and/or other treatments. The semiconductor dopants in the target are uniformly distributed within the metal.

In one embodiment, a heavy inert gas 303 such as argon is supplied to the vacuum chamber 300 and a pumping system (not shown) maintains the desired gas pressure in the chamber. Using conventional means, a glow discharge plasma can be created in the low pressure gas, at least partially ionizing the gas. If the target is properly biased, positive ions from the plasma can accelerate towards the target, resulting in the target material 305 being sputtered and ejected from the target. Some of the ejected target material is deposited onto the semiconductor substrate 201 to form the mixture film 203.

In one embodiment, a semiconductor dopant content of the metal and semiconductor dopant mixture is about 0.1 percent to about 5 percent. The metal can be any of nickel Ni, platinum Pt, titanium (Ti), cobalt (Co), tungsten (W) and Molybdenum (Mo) or a mixture or alloy of two or more thereof. The semiconductor dopant can be one or more P-type dopants such as boron (B), boron fluoride (BF2), indium (Indium) or any mixture thereof; or one or more N-type dopants such as phosphorus (P), arsenic (As) or any mixture thereof.

In Step 103, wet etching is performed to remove the mixture film. Conventional wet etching technologies can be used to remove the mixture film on a surface of the semiconductor substrate.

Figure 2E:
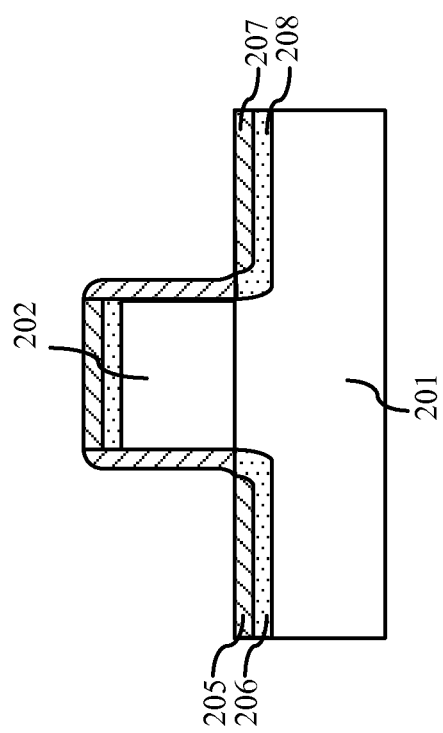

In Step 104, annealing is performed on the semiconductor substrate after the mixture film is deposited and then removed to form metal silicide(s) and ultra-shallow junctions. As shown in FIG. 2E, metal silicide contact regions 205 and 207 are formed at the source and drain, respectively, while reference numerals 206 and 208 denote dopant diffusion regions at the source and drain, respectively. Normally, dopant diffusion regions 206/208 should form P-N junctions with the semiconductor substrate, and metal silicide 205/207 form ohmic contacts with the dopant diffusion regions 206/208. When the formed dopant diffusion regions 206 and 208 are sufficiently shallow (e.g., <1.5 nm), however, the metal silicide 206/208 can form metal-semiconductor contacts with the semiconductor substrate.

In one embodiment, a conventional rapid thermal annealing (RTP) process is used in Step 103. In a further embodiment, a microwave heating annealing process is used. The microwave heating annealing process can be used to form the metal silicide(s) and ultra-shallow junctions at relatively low temperature, resulting in stable metal silicide(s). Additionally, during the deposition of the mixture film on the semiconductor substrate, the substrate temperature should be between 0 to 300° C. Depending on the temperature for metal silicide formation and the maximum temperature under which metal silicide can exist stably, the annealing temperature can be between 200 to 1000° C. in Step 102, metal and semiconductor dopants diffuse into the semiconductor substrate, forming metal silicide(s). During annealing, the semiconductor dopants in the metal silicide(s) continue to diffuse into the semiconductor substrate, thereby forming the ultra-shallow junctions. The temperature at which metal silicides are formed and stably exist is relatively low. For example, the temperatures at which nickel silicide (NiSi), cobalt silicide ($CoSi_2$), and titanium silicide ($TiSi_2$) can stably exist are less than 600, 700, and 1000° C., respectively. Therefore, when metal suicides and ultra-shallow junctions are formed under relatively low temperatures, it is possible that the semiconductor dopants in the semiconductor substrate are not fully activated. If they are fully activated, PN junctions should be formed. If they are not fully activated, metal semiconductor junctions (i.e., Schottky junctions) would be formed. Thus, in the process of forming ultra-shallow junctions and ultra-thin metal silicide(s), the ultra-shallow junctions formed may be PN junctions, or metal semiconductor junctions.

Note that by using microwave heating technology for annealing, metal silicide(s) and ultra-shallow junctions can be formed at relatively low temperature, and the metal silicide(s) can stably exist. Furthermore, different materials on the substrate absorb microwave energy differently and microwave heating is closely related to defects in the substrate. The existance of dopants in the semiconductor, and any semiconductor crystal lattice damages caused by other factors can be regarded as defects, which, can increase the ability to absorb microwave energy, i.e., the more defects, the higher the microwave heating efficiency. Thus, using microwave heating for annealing can enhance the heating efficiency.

Note that the mixture film includes metal and semiconductor dopants, during microwave heating annealing, multi-mode and multi-frequency microwaves are provided in a microwave-heating chamber in order to heat up both metal and semiconductor dopants. In one embodiment, a maximum temperature of the semiconductor substrate during annealing does not exceed 700° C. In one embodiment, medium (or peak) microwave frequencies are between 1.5 GHz and 15 GHz, so as to provide sufficient heating of the different materials. Furthermore, when performing microwave annealing, the micro electromagnetic waves should have a Gaussian distribution near about 5.8 GHz in a microwave-annealing chamber, and multiple microwave frequencies with intervals of about 30 Hz to about 50 Hz can be used. At the same time, the microwaves with the different frequencies should have multi-mode characteristics in the microwave annealing chamber, so as to insure heating consistency and uniform distribution of microwave energies in the microwave annealing chamber, leading to uniform and consistent heating of the substrate.

Compared to conventional technologies, embodiments of the present disclosure form metal silicide thin film and ultra-shallow junctions by forming a mixture film on a semiconductor substrate using a physical vapor deposition (PVD) process and removing the mixture film by wet etching, which is followed by annealing to form metal silicide thin film and ultra-shallow junctions. The PVD process uses a metal and semiconductor dopant mixture as a target. Because the metal and semiconductor dopant mixture is used as a target to deposit the mixture film, and the mixture film is removed by wet etching before annealing, self-limiting, ultra-thin, and uniform metal silicide film and ultra-shallow junctions are formed concurrently in semiconductor field-effect transistor fabrication processes, which are suitable for field-effect transistors at the 14 nm, 11 nm, or even further technology node.

In a further embodiment, the above-described method can be further improved to make a limited, uniform, and ultra-thin metal silicide film and ultra-shallow junctions by repeatedly depositing a mixture film and removing it by wet etching before annealing. That is, before annealing, mixture film deposition and removal by wet etching are performed multiple times, and a thickness of the metal silicide film and a depth of the ultra-shallow junctions can be limited by the number of repetitions, resulting in more uniformity in the finally formed metal silicide film and ultra-shallow junctions.

In a further embodiment, as a mixture film is repeatedly deposited and removed by wet etching, different mixture of metal and semiconductor dopants can be used as the target. For example, a mixture containing platinum and boron can be used as a target to deposit a mixture film for a first time, while a mixture containing nickel and boron, or a mixture of nickel and indium, can be used as a target to deposit a mixture film for the second time after the mixture film deposited for the first time has been removed by wet etching, or vice versa. Thus, one or more metals used to fabricate the metal silicide film can be selected according to practical requirements, allowing a larger selection of metals to be used to make the metal silicide, so as to minimize the resistance of the metal silicide and to allow more flexible applications.

According to an alternative embodiment, a method of making a limited, ultrathin, and uniform metal silicide film and ultra-shallow junctions includes using high-power impulse magnetron sputtering (HiPIMS) technologies to perform PVD deposition, in which a target is ionized and substrate bias voltage is applied to a semiconductor substrate when a mixture film is deposited. On one hand, metal ions and semiconductor dopant ions are accelerated towards and deposited on the semiconductor substrate, allowing control of a depth of ion diffusion. On the other hand, the thin film deposited on a three dimensional structure can have enhanced uniformity and stability.

Specifically, in the process of depositing a mixture film using PVD with a metal and semiconductor dopant mixture as a target, the target material is ionized to form metal ions and semiconductor dopant ions, and a substrate bias is applied to the semiconductor substrate. In one embodiment, the target material is ionized to an ionic state by applying a first biase voltage $V_1$ to the target, as shown in FIG. 3.

The first bias voltage can be a direct current bias voltage, an alternating current bias voltage or a pulsed bias voltage. The magnitude of the first bias voltage is dependent on the type of PVD system used, i.e., the magnitude of the first bias voltage varies among different PVD systems. Generally, the first bias voltage should be about 200V to about 1000V, which, for an alternating current bias voltage or pulsed bias voltage, should be the root-mean-square (RMS) value. Also, the substrate bias voltage can be a direct current bias voltage, an alternating current bias voltage or a pulsed bias voltage. The magnitude of the substrate bias voltage is adjustable. By adjusting the substrate bias voltage, an amount of metal ions diffusing to a surface of the semiconductor substrate can be adjusted, resulting in a thickness of the eventually formed metal-semiconductor compound thin film to be adjustable. Generally, the substrate bias voltage is about 200V to about 1000V, which, for an alternating current bias voltage or pulsed bias voltage, should be the root-mean-square (RMS) value.

The above methods are divided in steps for ease of description. In practice, multiple steps can be combined into one step and certain step can be further divided into multiple steps.

As shown in FIG. 2E, according to one embodiment, a metal silicide film and ultra-shallow junctions are formed by depositing a mixture film on the semiconductor substrate using a physical vapor deposition (PVD) process with a metal and semiconductor dopant mixture as a target, and removing the mixture film by wet etching, which is followed by annealing. The ultra-shallow junctions are PN junctions or metal-semiconductor junctions.

In one embodiment, the content of semiconductor dopants in the mixture of metal and semiconductor dopants is about 0.1% to about 5%. The metal can be any of nickel Ni, platinum Pt, titanium (Ti), cobalt (Co), tungsten (W) and Molybdenum (Mo) or a mixture or alloy of two or more thereof. While nickel is preferred for most applications, nickel is often mixed with Pt, W or other of the above metals for stability and Schottky barrier height tuning purpose. The semiconductor dopant can be one or more P-type dopants such as boron (B), boron fluoride (BF2), indium (Indium) or any mixture thereof; or one or more N-type dopants such as phosphorus (P), Arsenic (As) or any mixture thereof. In one embodiment, the metal silicide has a thickness of about 3-12 nm; the ultra-shallow junctions have a depth about 1-15 nm; a peak doping concentration in the ultra-shallow junctions in the source/drain regions is about $2e^{19}$-$2e^{20}$/cm$^3$, and the gate structure has a gate length of about 7-25 nm.

The embodiment of the ultra-shallow junction semiconductor field-effect transistor corresponds to the above embodiments of the methods of making the ultra-shallow junction transistors. Thus, some of the details in the above-described method embodiments, which are applicable to the transistor embodiment, are not repeated. Correspondingly, any details related to the transistor embodiment can also be applicable to the description of the above method embodiments.

Those of ordinary skill in the art can understand that the above descriptions are related to specific embodiments of the present invention, and various modifications in form and detail can be made in practice without departing from the spirit and scope of the present invention.

We claim:

1. A method of making a metal silicide thin film and ultra-shallow PN junctions, comprising:
    A. providing a semiconductor substrate;
    B. using a first mixture of metal and semiconductor dopants as a target, depositing a first mixture film on the semiconductor substrate by physical vapor deposition;
    C. removing the first mixture film by wet etching; and
    D. performing annealing on the semiconductor substrate subsequent to the wet etching thereby forming concurrently the metal silicide thin film and ultra-shallow PN junctions;
    wherein before step D, steps B and C are repeated such that a second mixture film is deposited after the first mixture film is removed, and that the second mixture film is removed by wet etching before step D is performed;
    wherein the ultra-shallow PN junctions have a depth about 1-15 nm.

2. The method of making a metal silicide thin film and ultra-shallow PN junctions according to claim 1, wherein as steps B and C are repeatedly performed, a different mixture of metal and semiconductor dopants is used as a target to deposit the second mixture film by physical vapor deposition, the different mixture of metal and semiconductor dopants comprising at least one metal that is different from any metal in the first mixture of metal and semiconductor dopants.

3. The method of making a metal silicide thin film and ultra-shallow PN junctions according to claim 1, wherein in step B, a target material is ionized into an ionic state, causing it to produce metal ions and semiconductor dopant ions, and wherein a substrate bias voltage is applied to the semiconductor substrate.

4. The method of making a metal silicide thin film and ultra-shallow PN junctions according to claim 3, wherein a first bias voltage is applied to the target to ionize the target material into an ionic state.

5. The method of making a metal silicide thin film and ultra-shallow PN junctions according to claim 4, wherein the first bias voltage is one of a direct current bias voltage, an alternating current bias voltage and a pulsed bias voltage.

6. The method of making a metal silicide thin film and ultra-shallow PN junctions according to claim 3, wherein a substrate bias voltage is applied to the semiconductor substrate during the physical vapor deposition, and wherein the substrate bias voltage is one of a direct current bias voltage, an alternating current bias voltage and a pulsed bias voltage.

7. The method of making a metal silicide thin film and ultra-shallow PN junctions according to claim 1, wherein microwave annealing is used in step D, thereby forming the metal silicide thin film and the ultra-shallow PN junctions at a temperature under which the metal silicide thin film can stably exist.

8. The method of making a metal silicide thin film and ultra-shallow PN junctions according to claim 7, wherein during microwave annealing, multi-mode and multi-frequency microwaves are provided in a microwave-heating chamber so as to heat up both metal and semiconductor dopants remaining on the semiconductor substrate.

9. The method of making a metal silicide thin film and ultra-shallow PN junctions according to claim 8, wherein during microwave annealing, a maximum temperature of the semiconductor substrate during annealing does not exceed 700° C., and microwave frequencies have a Gaussian distribution near 5.8 GHz.

10. The method of making a metal silicide thin film and ultra-shallow PN junctions according to claim 1, wherein the metal is any of nickel (Ni), platinum (Pt), titanium (Ti), cobalt (Co), tungsten (W) and Molybdenum (Mo) or a mixture or alloy of two or more thereof.

11. The method of making a metal silicide thin film and ultra-shallow PN junctions according to claim 1, wherein the semiconductor dopant can be one or more P-type dopants selected from the group consisting of boron (B), boron fluoride (BF2), indium (Indium) and any mixture thereof; or one or more N-type dopants selected from the group consisting of phosphorus (P), arsenic (As) and any mixture thereof.

12. The method of making a metal silicide thin film and ultra-shallow PN junctions according to claim 1, wherein a semiconductor dopant content in the metal and semiconductor dopant mixture is about 0.1% to about 5%.

13. The method of making a metal silicide thin film and ultra-shallow PN junctions according to claim 1, wherein the semiconductor substrate includes silicon (Si), germanium (Ge), silicon-germanium alloy (SiGe), and/or any of the III-V semiconductors.

14. The method of making a metal silicide thin film and ultra-shallow PN junctions according to claim 1, wherein the semiconductor substrate is at a temperature between 0 and 300° C. during deposition of the mixture film on the semiconductor substrate in step B.

15. The method of making a metal silicide thin film and ultra-shallow PN junctions according to claim 1, wherein an annealing temperature is between 300 to 800° C. in step D.

16. A method of making a metal silicide thin film and ultra-shallow metal-semiconductor junctions, comprising:
    A. providing a semiconductor substrate;
    B. using a first mixture of metal and semiconductor dopants as a target, depositing a first mixture film on the semiconductor substrate by physical vapor deposition;
    C. removing the first mixture film by wet etching; and
    D. performing annealing on the semiconductor substrate subsequent to the wet etching thereby forming concurrently the metal silicide thin film and ultra-shallow metal-semiconductor junctions;
    wherein before step D, steps B and C are repeated performed such that a second mixture film is deposited after the first mixture film is removed, and that the second mixture film is removed by wet etching before step D is performed;
    wherein the ultra-shallow metal-semiconductor junctions have a depth about 1-15 nm.

17. The method of making a metal silicide thin film and ultra-shallow metal-semiconductor junctions according to claim 16, wherein as steps B and C are repeatedly performed, a different mixture of metal and semiconductor dopants is used as a target to deposit the second mixture film by physical vapor deposition, the different mixture of metal and semiconductor dopants comprising at least one metal that is different from any metal in the first mixture of metal and semiconductor dopants.

* * * * *